US012073513B1

(12) United States Patent
Yuan et al.

(10) Patent No.: US 12,073,513 B1
(45) Date of Patent: Aug. 27, 2024

(54) MESH IMPRINT IN PRIORITY MESH GENERATION FOR DIRTY MODELS

(71) Applicant: Ansys, Inc., Canonsburg, PA (US)

(72) Inventors: Wei Yuan, Sewickley, PA (US); Yunjun Wu, Pittsburgh, PA (US); Yiran Su, Canonsburg, PA (US)

(73) Assignee: ANSYS, INC., Canonsburg, PA (US)

( * ) Notice: Subject to any disclaimer, the term of this patent is extended or adjusted under 35 U.S.C. 154(b) by 254 days.

(21) Appl. No.: 16/677,743

(22) Filed: Nov. 8, 2019

Related U.S. Application Data

(60) Provisional application No. 62/757,847, filed on Nov. 9, 2018.

(51) Int. Cl.
*G06T 17/20* (2006.01)
*G06T 7/13* (2017.01)

(52) U.S. Cl.
CPC ............ *G06T 17/205* (2013.01); *G06T 7/13* (2017.01)

(58) Field of Classification Search
None
See application file for complete search history.

(56) References Cited

U.S. PATENT DOCUMENTS

| | | | | |
|---|---|---|---|---|
| 2003/0076319 A1* | 4/2003 | Hiraga | ...................... | G06K 9/48 345/420 |
| 2004/0044507 A1* | 3/2004 | Aoki | ...................... | G06F 30/23 703/6 |
| 2005/0151755 A1* | 7/2005 | Bentley | ................... | G06T 11/60 345/619 |
| 2008/0036765 A1* | 2/2008 | Hariya | .................... | G06T 17/20 345/423 |
| 2012/0256915 A1* | 10/2012 | Jenkins | ................... | G06T 15/40 345/419 |
| 2013/0300741 A1* | 11/2013 | Schmidt | .................. | G06T 19/20 345/420 |
| 2018/0068590 A1* | 3/2018 | Mattausch | .......... | G09B 23/286 |
| 2019/0043254 A1* | 2/2019 | Taubin | .................... | G06T 15/08 |
| 2019/0066380 A1* | 2/2019 | Berk | ....................... | G06F 3/011 |
| 2019/0147649 A1* | 5/2019 | Brochu | ................ | G06T 17/205 345/420 |

FOREIGN PATENT DOCUMENTS

WO    WO-2019126653 A1 *  6/2019  ............... G06T 7/50

OTHER PUBLICATIONS

White D.R., Saigal S., "Improved Imprint and Merge for Conformal Meshing," 2002, Proceedings, 11th International Meshing Roundtable, Springer-Verlag, pp. 285-296, retrieved from "https://imr.sandia.gov/papers/imr11/white.pdf", Accessed Mar. 25, 2021 (Year: 2002).*

(Continued)

*Primary Examiner* — Michael J Cobb
(74) *Attorney, Agent, or Firm* — Womble Bond Dickinson (US) LLP

(57) ABSTRACT

Techniques for meshing a plurality of objects include determining, for at least a portion of the objects, a respective priority level. A mesh is then generated for each object. Thereafter, at least a portion of the meshes are sequentially imprinted to each other such that conflicts arising between meshes are resolved in favor of an object having a higher priority level. Related apparatus, systems, techniques and articles are also described.

20 Claims, 9 Drawing Sheets

(56) References Cited

OTHER PUBLICATIONS

Graf H., Serna S.P. and Stork A., "Adaptive Quality Meshing for "on-the-fly" Volumetric Mesh Manipulations within Virtual Environments," 2006 IEEE Symposium on Virtual Environments, Human-Computer Interfaces and Measurement Systems, pp. 178-183, doi: 10.1109/VECIMS.2006.250817. (Year: 2006).*
Benjamin Wassermann, Stefan Kollmannsberger, Shuohui Yin, Láslo Kudela, Ernst Rank, Integrating CAD and numerical analysis: Dirty geometry handling using the Finite Cell Method, 2019, Computer Methods in Applied Mechanics and Engineering, 351:808-835 https://doi.org/10.1016/j.cma.2019.04.017 (Year: 2019).*
Jeongsam Yang, Soonhung Han, "Repairing CAD Model Errors based on Design History", 2006, Computer-Aided Design 38(2006):627-640 https://doi.org/10.1016/j.cad.2006.02.007 (Year: 2006).*
Z.J. Wang, Kumar Srinivasan, An Adaptive Cartesian Grid Generation Method for 'Dirty' Geometry, 2002, International Journal for Numerical Methods in Fluids, 39:703-717 DOI: 10.1002/fld.344) (Year: 2002).*
Ting W. Chin, Graeme J. Kennedy, "Efficient Large-Scale Thermoelastic Topology Optimization from CAD Geometry with Automated Adaptive Mesh Generation," 2018, AIAA 2018-1381 Session: Emerging Trends in MAO, https://doi.org/10.2514/6.2018-1381 (Year: 2018).*
Antonio C.O. Miranda, William W.M. Lira, Joaquim B. Cavalcante-Neto, Rafael A. Sousa, Luiz F. Martha, "A Three-Dimensional Adaptive Mesh Generation Approach Using Geometric Modeling with Multi-Regions and Parametric Surfaces," 2013, J Comput Inf Sci Eng, 13(2):021002 https://doi.org/10.1115/1.4024106 (Year: 2013).*
Xiaokun Li, Chia-Yung Han, William G. Wee, "On Surface Reconstruction: A priority Driven Approach," 2009, Computer Aided Design 41:626-640 (Year: 2009).*
Ji Ma, Jack Szu-Shen Chen, Hsi-Yung Feng, Lihui Wang, "Automatic Construction of Watertight Manifold Triangle Meshes From Scanned Point Clouds Using Matched Umbrella Facets," 2017, Computer-Aided Design & Applications 14(6)742-750 (Year: 2017).*
ZJ Wang, Kumar Srinivasan, An Adaptive Cartesian Grid Generation Method for 'Dirty' Geometry, 2002, Int. J. Numer. Meth. Fluids 39:703-717 DOI: 10.1002/fld.3344 (Year: 2002).*
Mark W. Beall, Joe Walsh, Mark S. Shephard, A Comparison of Techniques for Geometry Access Related to Mesh Generation, 2004, Engineering with Computers 20:210-221 DOI: 10.1007/s00366-004-0289-x (Year: 2004).*
Alexander V. Shevelko, Octree-based Projection Mesh Generation for Complex Dirty Geometries, 2006, Doctoral Thesis, University of Brighton, pp. 1-181 (Year: 2006).*

\* cited by examiner

MESH IMPRINT IN PRIORITY MESH GENERATION FOR DIRTY MODELS

RELATED APPLICATION

This application claims priority to U.S. Patent Application No. 62/757,847, filed Nov. 9, 2018, the entirety of which is herein incorporated by reference.

TECHNICAL FIELD

The subject matter described herein relates to advanced techniques for generating meshes in computer-aided engineering (CAE) software when 'dirty' model conditions exist.

BACKGROUND

Mesh generation for finite element analysis (FEA) of systems is a complex process that is time consuming and computationally intensive especially when there are multiple objects being modeled. Certain conditions, sometimes referred to as 'dirty' models, can both increase the amount of time required to render objects as well as the computational resources required to generate the corresponding meshes. For example, in some cases, there can be tiny misalignments between bodies that lead to unwanted tiny gaps or body-body overlaps. As another example, a 'dirty' model can exist when a surface of an object has a non-manifold topology meaning that at some points of the surface no neighborhood can be continuously deformed into a disk. As yet another example, a model can be characterized as 'dirty' if there is a self-intersection, a situation in which a part of a surface collides with another part of itself. Moreover, the model can be 'dirty' if there is a twisted flaw, i.e., a topological soliton in which two adjoining structures or spaces are out of phase with each other in ways that make a seamless transition between them impossible.

SUMMARY

In a first aspect, a plurality of objects are meshed by determining a respective priority level for at least a portion of the objects. The objects are then sequentially meshed according to their respective priority levels.

The sequential meshing can include imprinting objects to each other based on their respective priority levels. In some variations, conflicts that arise when imprinting an object having a higher priority level to an object having a lower priority level are resolved in favor of the object with the higher priority level.

The sequential meshing can include ignoring edges on a first object that intersect with a second object. The second object can have a higher priority level than the first object.

The meshes can be part of an adaptive volume mesh.

A dirty model condition can exist that comprises at least one of: self-intersection of a mesh, a non-manifold condition, or a twisted flaw model.

Further, visualizations can be rendered in a graphical user interface that correspond to the sequentially meshed objects.

In an interrelated aspect, techniques for meshing a plurality of objects include determining, for at least a portion of the objects, a respective priority level. A mesh is then generated for each object. Thereafter, at least a portion of the meshes are sequentially imprinted to each other such that conflicts arising between meshes are resolved in favor of an object having a higher priority level.

Non-transitory computer-readable storage media (e.g., non-transitory computer program products, etc.) are also described that include instructions, which when executed by one or more data processors of one or more computing systems/devices, cause at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. For example, the current subject matter provides enhanced techniques for generating meshes when modeling objects having a 'dirty' model that use fewer computing resources (e.g., memory, processor usage, etc.). Further, the current subject matter is advantageous in that it can more rapidly generate meshes by selectively skipping self-healing operations without affecting/materially affecting any corresponding simulation results.

The details of one or more variations of the subject matter described herein are set forth in the accompanying drawings and the description below. Other features and advantages of the subject matter described herein will be apparent from the description and drawings, and from the claims.

DETAILED DESCRIPTION

The current subject matter provides techniques for top-down volumetric mesh generation in which objects being modeled are meshed according to a corresponding priority level to minimize conditions (i.e., a 'dirty' model condition) that prevent fast and successful mesh generation in a computer-aided engineering (CAE) software program. The meshes act to break a large complex object into many smaller simple elements allows the CAE software program to, for example with finite element analysis, simulate physical behavior for those complex objects through various simulations. Once the CAE software program has evaluated the behavior of each discrete element, it can integrate the data from these elements to predict the physical behavior for the complex objects as a whole. The CAE software program can include one more optimization algorithms (sometimes referred to as a solver) that can cause the processing of various mesh elements according to various priority levels.

The CAE program enables the geometric operation of imprinting which can be characterized as a geometric Boolean operation between two objects or bodies. An intersection graph is calculated between two objects that includes edges that define how the two objects intersect each other. The graph is then split into parts that affect each object. The pieces of the graph are used to split the boundaries of the object.

Figure 1:
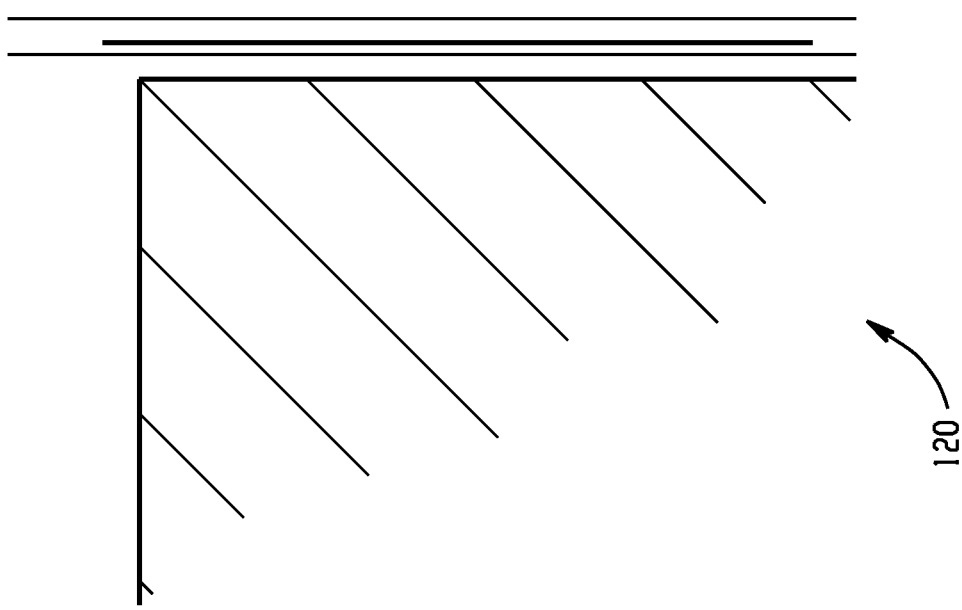
FIG. 1 is a diagram illustrating aspects related to prioritized meshing of objects in 2D with straight line misalignment.
Figure 1:
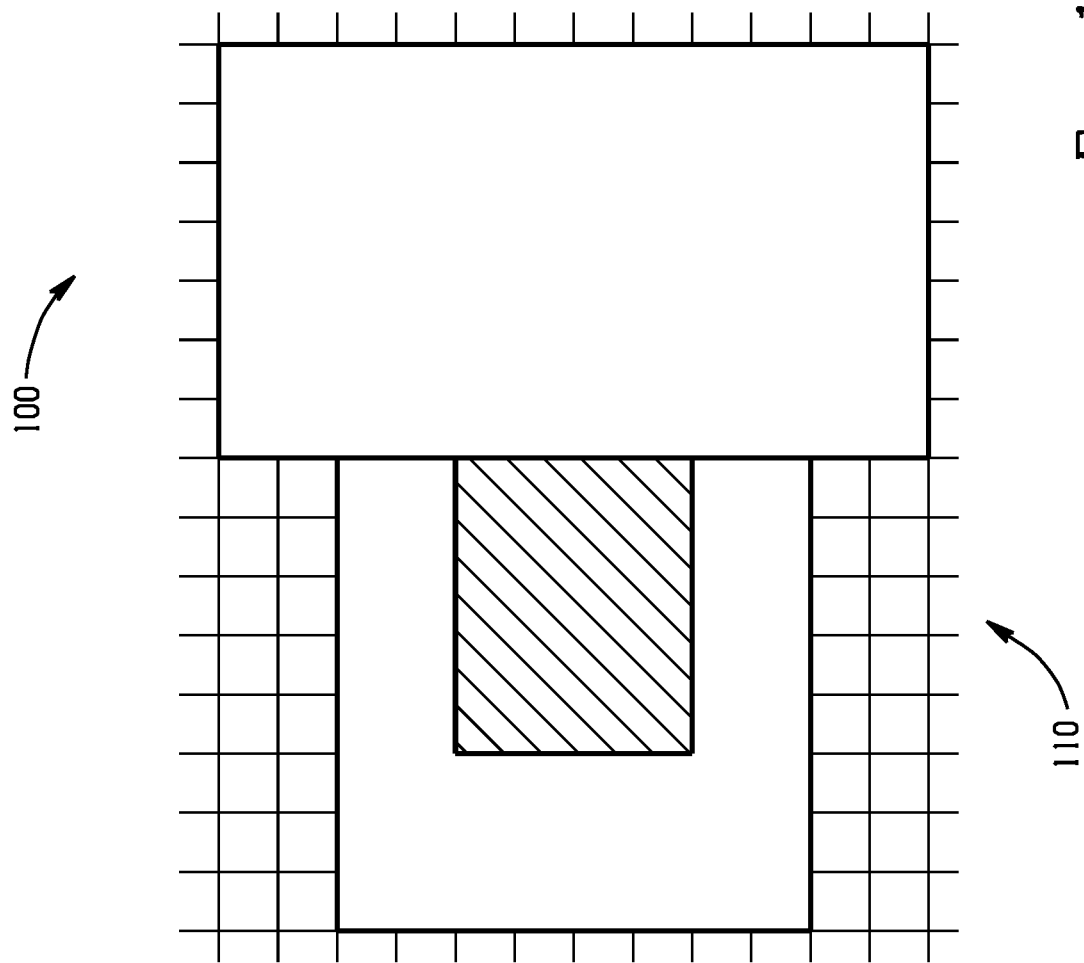

FIG. 1 is a diagram 100 illustrating a diagram of a 'dirty' model in 2D situation, including two views 110, 120 of three square-shaped objects and a straight-line object. The contacting interface of three square-shaped objects, marked as blue is supposed to be aligned with the straight-line object marked as black. View 120 shows a zoomed in view in which it can show that there is misalignment among multiple features. A boundary condition is assigned, either by user or solver, to the solid line object, which is marked as black.

Figure 2:
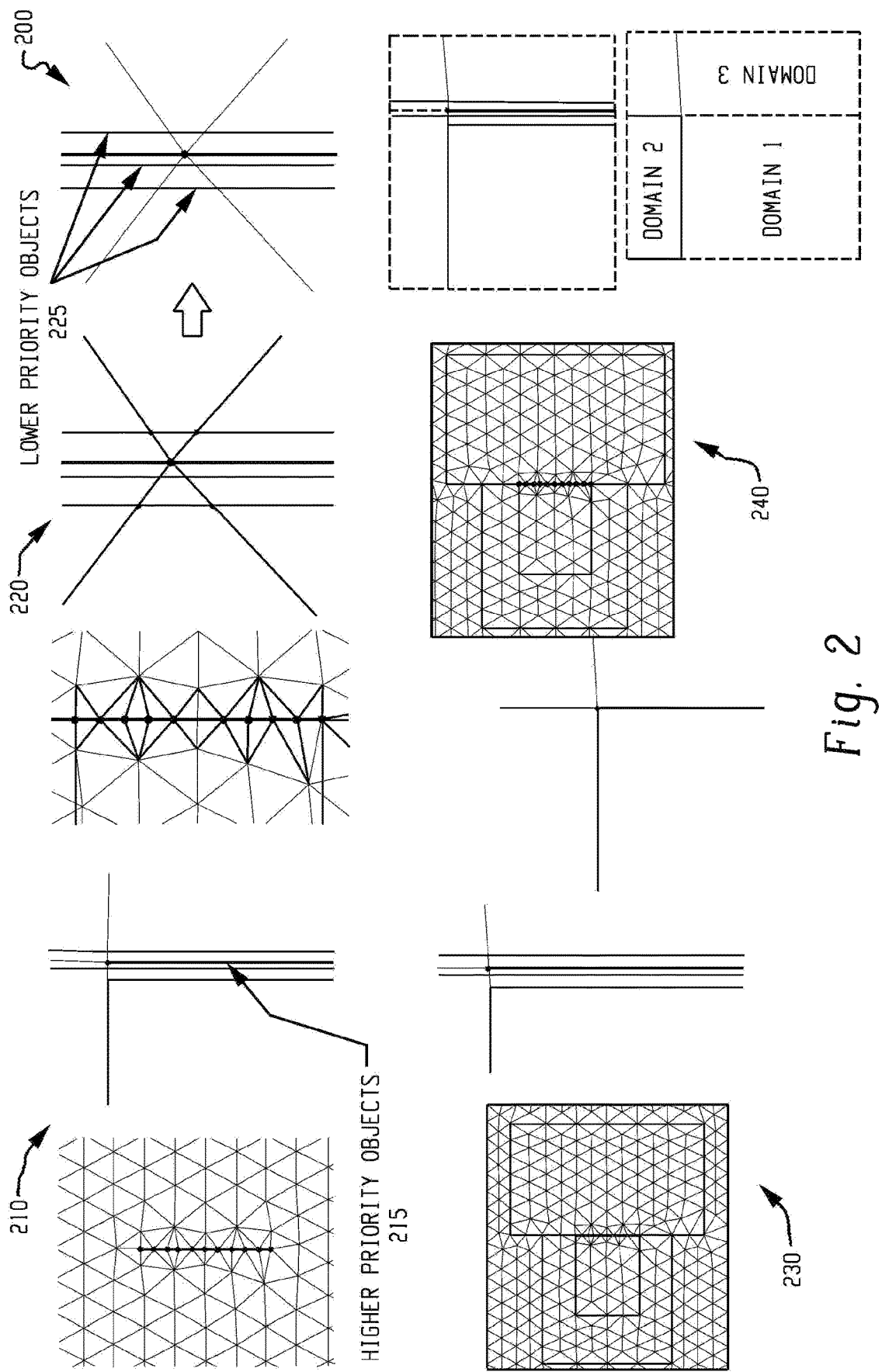
FIG. 2 is a diagram illustrating prioritized meshing of objects in connection with a planar handler.

FIG. 2 is a diagram 200 including various views 210-240 illustrating a mesh imprint using a priority mesher to handle 'dirty' model indicated in FIG. 1. Initially, in view 210, objects that have a higher priority (i.e., influential objects) can be prioritized. For example, object 215, on which a boundary condition is assigned, is deemed to have a higher priority. Stage 1, geometry features, i.e. objects, faces or edges, with highest priority among all features, i.e. object 215 in this example, are meshed, regardless of there are objects with lower priority in the meshing domain. Stage 2, geometry features with lower priority are meshed. During stage 2, the mesh edges intersecting with geometry features with lower priority can be located. For traditional top down mesh generation, all intersection mesh edges will be recovered, i.e. by adding mesh points or moving mesh edges. In this mesh imprint methods, only the mesh edges not connecting to any of the high priority features are recovered. All mesh edges having one or more vertex located on features with high priority, i.e. edges marked as red in view 220, can be ignored in recovering process (i.e., a healing operation that would otherwise have been implemented can be bypassed without affecting the simulation). Subsequently, as shown in view 230, the higher priority mesh is then imprinted to all adjacent lower priority objects. It is noted that there are originally some overlapping objects which, in view 240, are imprinted without overlapping. Further, importantly, in view 240, no healing operations (i.e., hole closing, spur and dent correction, etc.) are needed to generate the final mesh.

Figure 3:
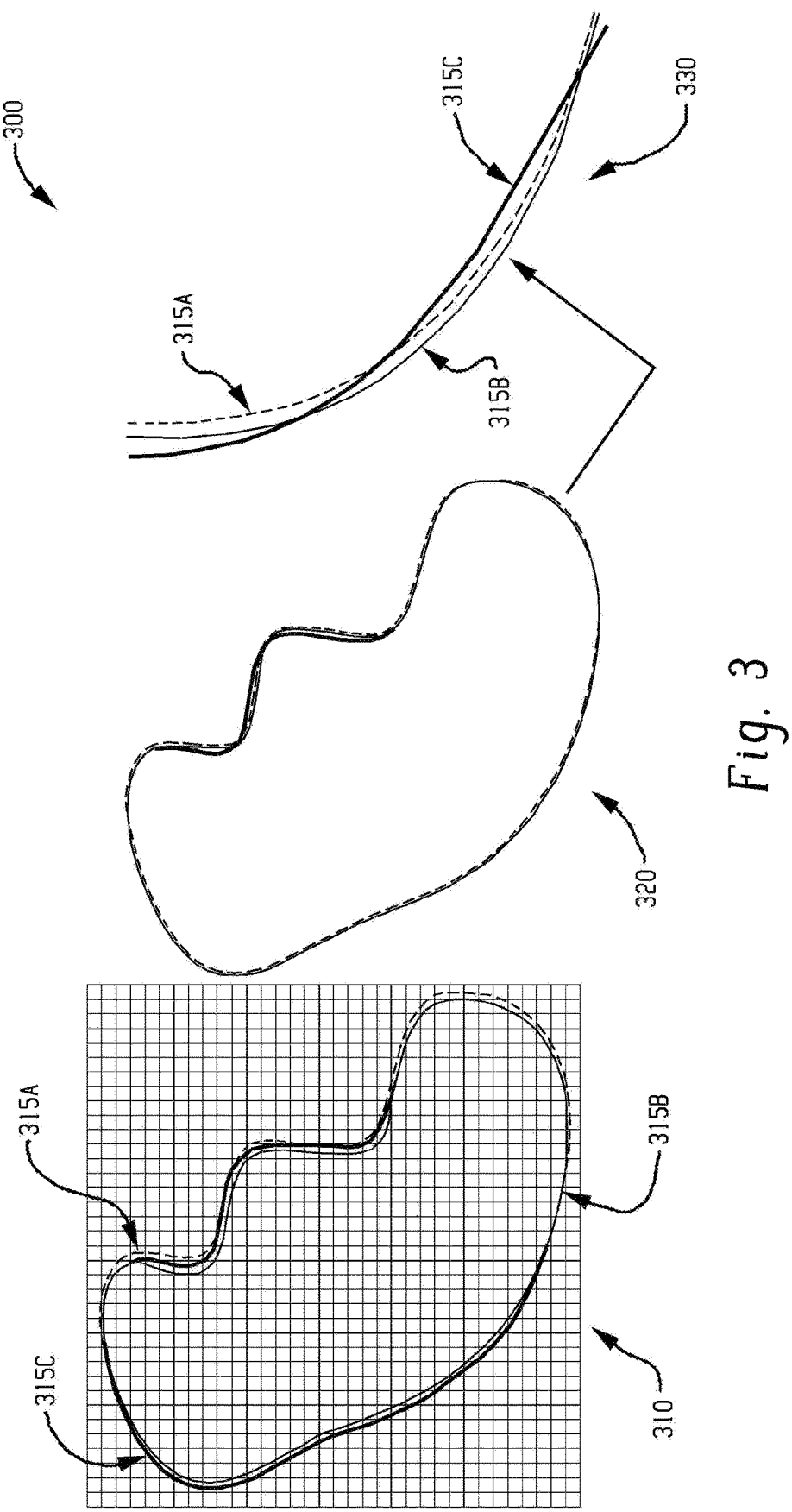
FIG. 3 is a first diagram illustrating prioritized meshing of objects in 2D with curve line misalignment.

FIG. 3 is a diagram 300 including various views 310, 320, 330 of another 'dirty' model in 2D with curve features. Such a situation can arise when influential objects are separately designed and then later added to the model. For example, for a telecommunications system, an influential curve antenna can be misaligned with a solid base carrier such that there is overlap. With traditional mesh generation methods, the resulting mesh might have holes, spurs, and dents such that computer-implemented simulations using the mesh may provide inaccurate results (which in some cases can be resolved through computationally expensive healing operations). There can be three overlapping objects: two solid objects (315A, 315B) with one being metal 315A and another being plastic 315B and a third object 315C being a wired object with a curved line in 2D, or a sheet object with a curved face in 3D. A boundary condition is assigned to object 315C, marked as red, either by the user or solver. Priority rank can be determined for geometry features in an electromagnetic simulation according to the object material and boundary conditions. The priority of these objects can be such that 315C>315A>315B. The three objects are supposed to be perfectly aligned at the curve interface. However, as can be seen in view 330, objects 315A marked as blue, 315B marked as green and 315C marked as red have misalignment and overlapping near the curve interface.

Figure 4:
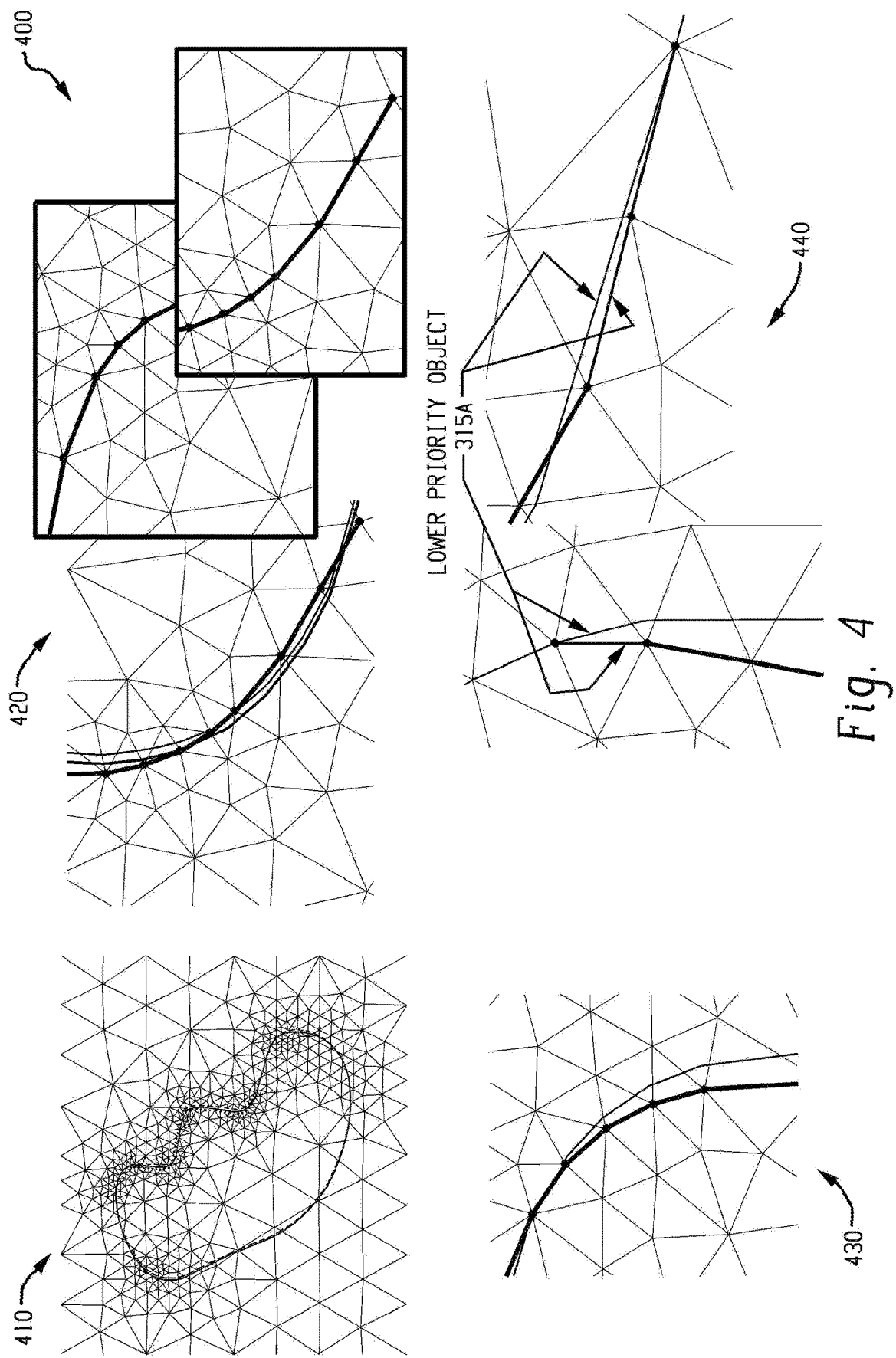
FIG. 4 is a second diagram illustrating prioritized meshing of objects in connection with a curve handler.

FIG. 4 is a first diagram 400 including views 410-440 which illustrate a mesh imprint using a priority mesher to handle 'dirty' model with curve misalignment as in FIG. 3. Initially, in view 410, an adaptive volume mesh is generated. Later, in view 420, the highest ranked object 315C is first meshed. Thereafter, in view 430, the second highest ranked object 315A is meshed in a manner so that mesh edges intersecting with features of 315A are recovered, with exclusion of those edges intersecting with features of 315A preserved on features of 315C. The imprint is then meshed to the lower priority object 315A as shown in view 440.

Figure 5:
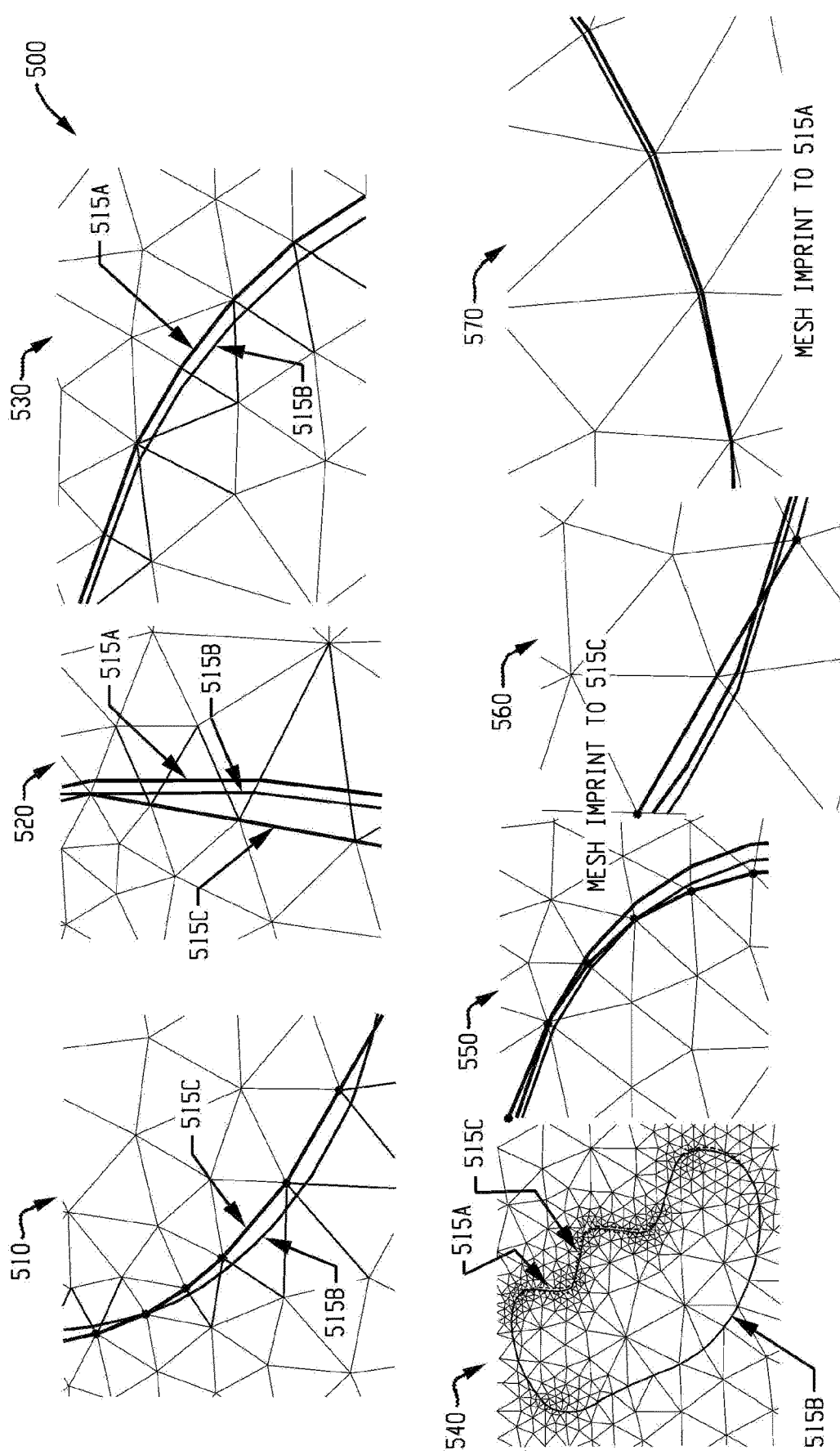
FIG. 5 is a third diagram illustrating prioritized meshing of objects in connection with a curve handler.

FIG. 5 is a second diagram 500 including views 510-570 which continue the illustration of a mesh imprint using a priority mesher to handle 'dirty' model with curve misalignment as in FIGS. 3 and 4. Views 510-530 illustrate the meshing of the lower priority object 515B, after meshing higher priority objects 515C and 515A. As illustrated in view 510, it is noted that mesh edges intersecting with geometry features of object 515B have already been preserved to geometry features of object 515C which has higher priority. With this conflict, the mesh for object 515C takes precedence and the mesh edges should not been recovered on object 515B. Similarly for view 520, the mesh for object 515A takes precedence over the mesh for object 515B and the mesh for object 515C takes priority over both. View 530 shows a situation in which the mesh for object 515A takes precedence over the mesh of 515B such that the mesh for object 515A is imprinted onto the mesh for object 515B. Views 530-570 illustrate various imprints with views 540, 550 showing a mesh imprint to object 515C and view 560 shows a mesh imprint to object 515A.

Figure 6:
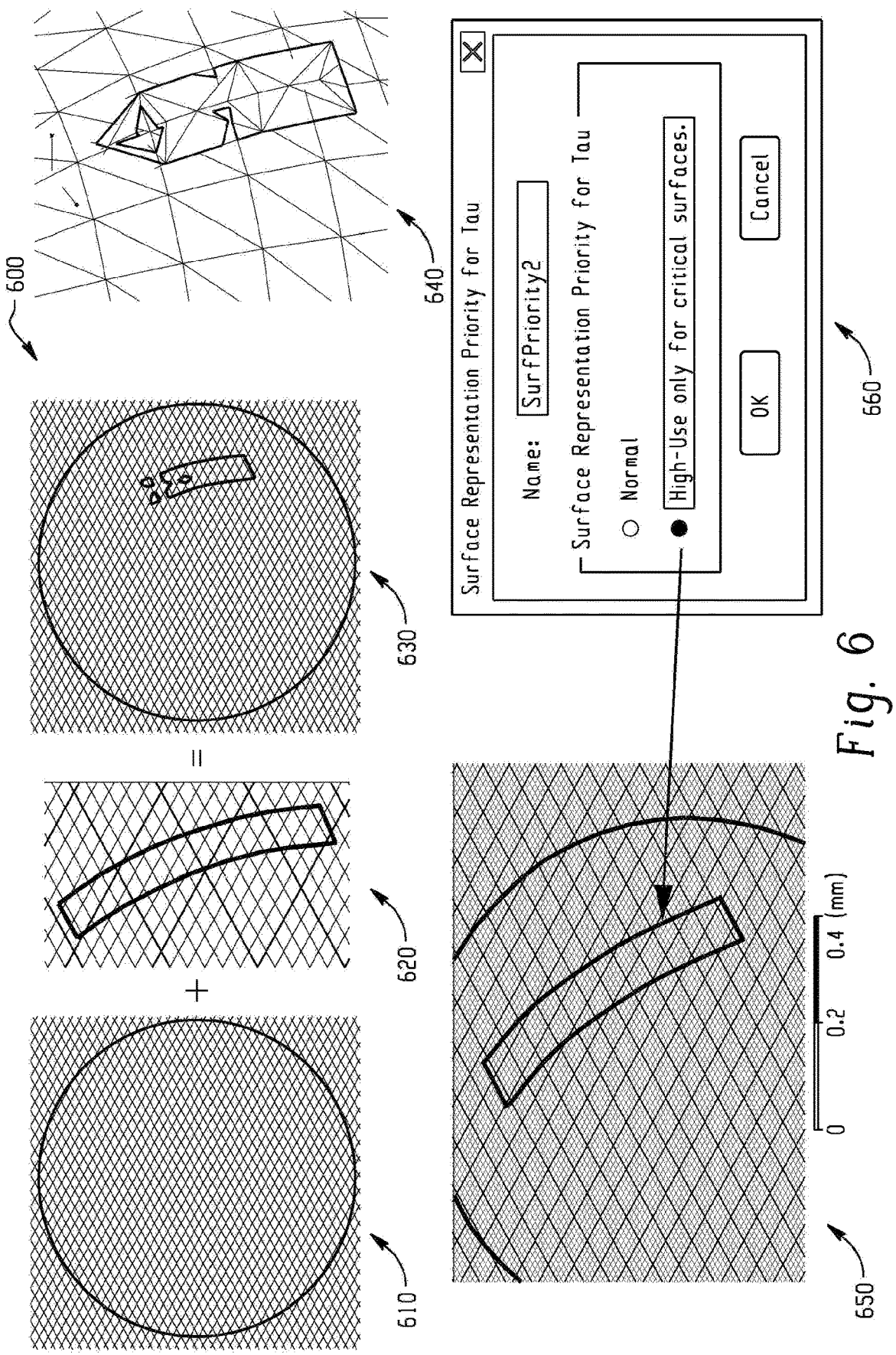
FIG. 6 is a fourth diagram illustrating prioritized meshing of objects in 3D with curve face misalignment.

FIG. 6 is a diagram 600 illustrating a workflow for a mesh imprint for a 'dirty' model in 3D with curved face misalignment using the priority mesher as provided herein. This example again relates to a curve handler in which there is a solid 3D object with curve face (610). A sheet 3D object with curve face (620) can be attached to the solid 3D object 710 as shown in (630), which results in a misalignment of the curve contact with some overlapping (640). A user can then, for example via a graphical user interface (650-660), specify that the sheet curve face should receive prioritized handling.

Figure 7:
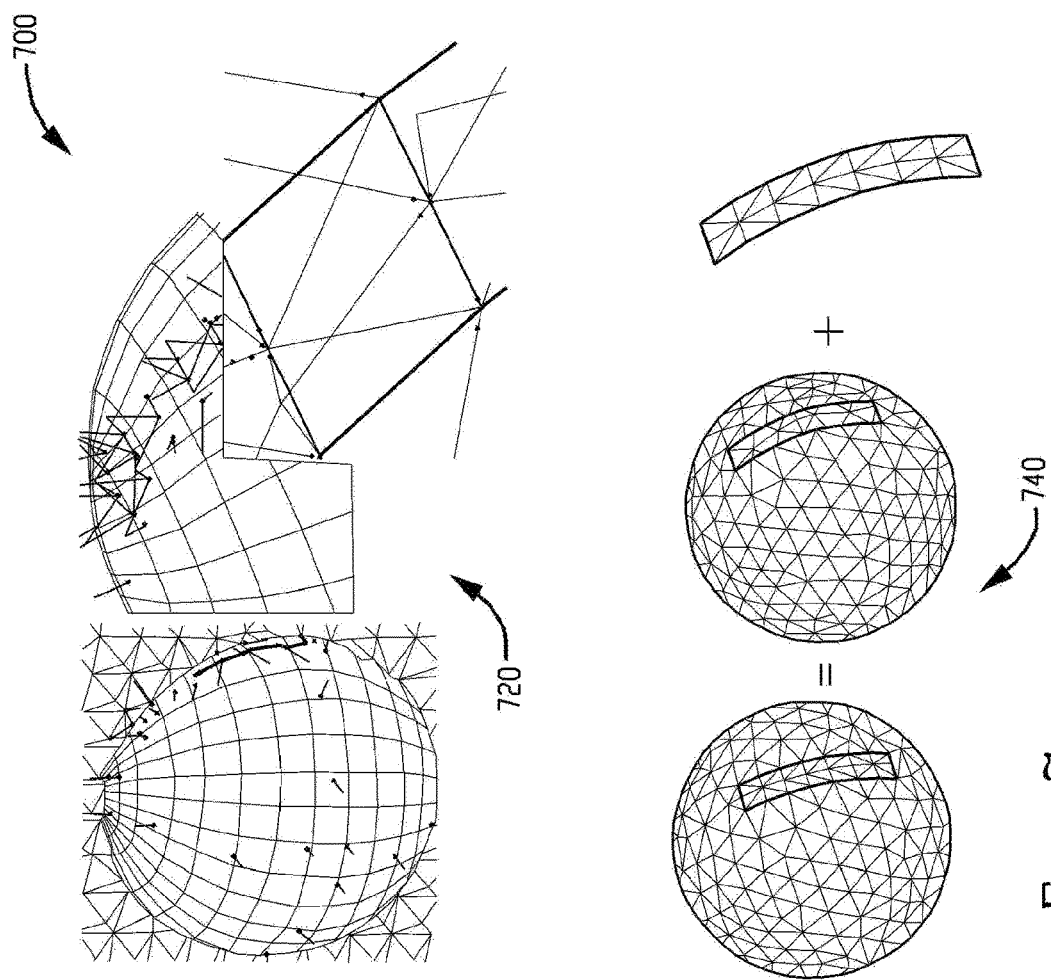
FIG. 7 is a fifth diagram illustrating prioritized meshing of objects in connection with a curve handler.
Figure 7:
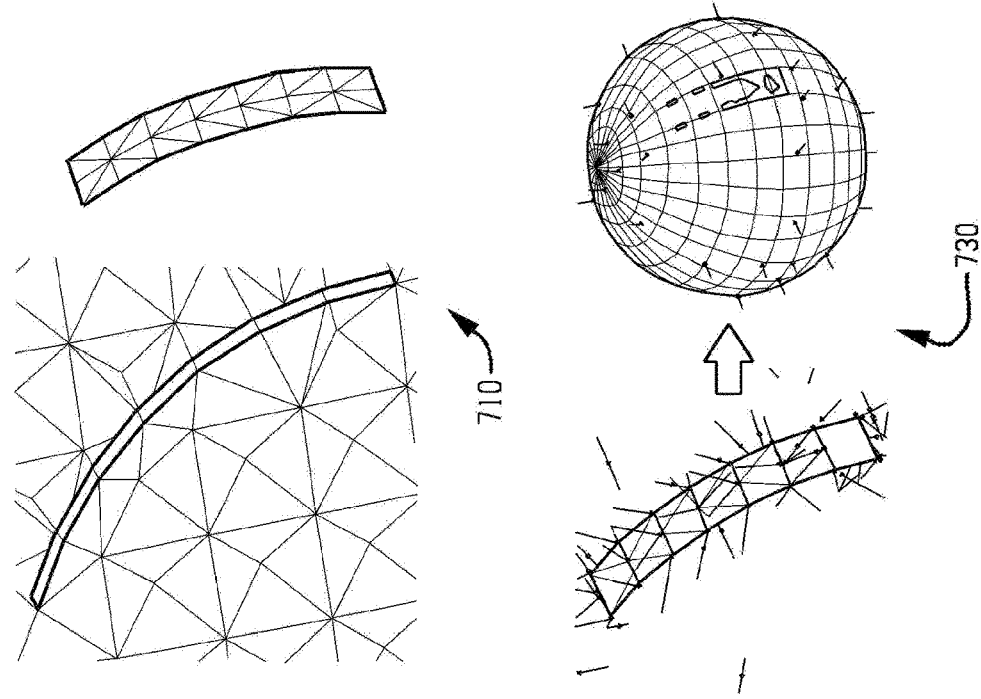

Further details regarding the mesh imprint of the workflow in FIG. 6 is illustrated in the diagram 700 of FIG. 7. In view 710, the higher priority object (i.e., the sheet curve surface 620) is meshed first. The mesh elements (i.e., triangles, edges and vertexes) preserved on geometry feature of high priority object are marked (using, for example, a flag in the data structure detailing the mesh). In view 720, the lower priority object (i.e., the solid object 610) is then meshed where it is shown that there are some intersecting edges due to the overlap of the geometry of the respective meshes. Thereafter, as show in view 730, as part of a mesh imprint process, all mesh edges intersecting with object 610, and marked as preserved mesh on higher priority object 620, are ignored in the recovery process. As shown in view 740, the mesh from the higher priority object is imprinted at the overlapping area on the mesh of the lower priority object. Such an arrangement can be continued across complex models having numerous objects (e.g., tens, hundreds, thousands, etc.) with varying priorities.

Figure 8:
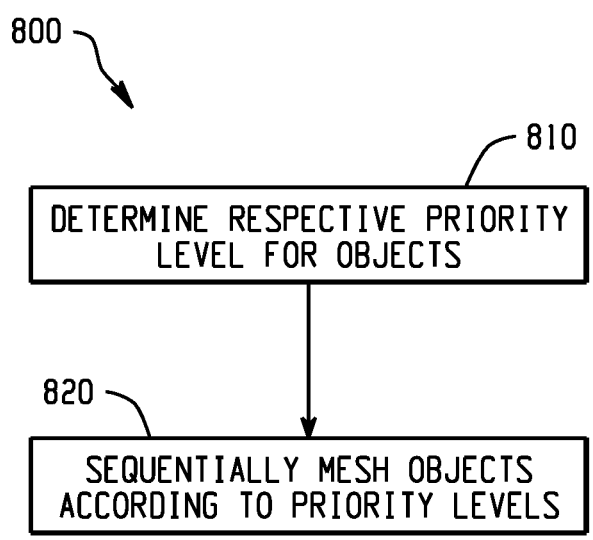
FIG. 8 is a process flow diagram illustrating priority mesh generation for dirty models.

FIG. 8 is a process flow diagram 800 for meshing a plurality of objects. Initially, at 810, a respective priority level is determined for at least a portion of the objects. The objects are then meshed at 820 in the order of descending priority level. For example, this meshing can include imprinting the meshes according to each other based on the corresponding priority levels such that conflicts arising between two meshes are resolved in favor of a mesh/object having a higher priority level.

Figure 9:
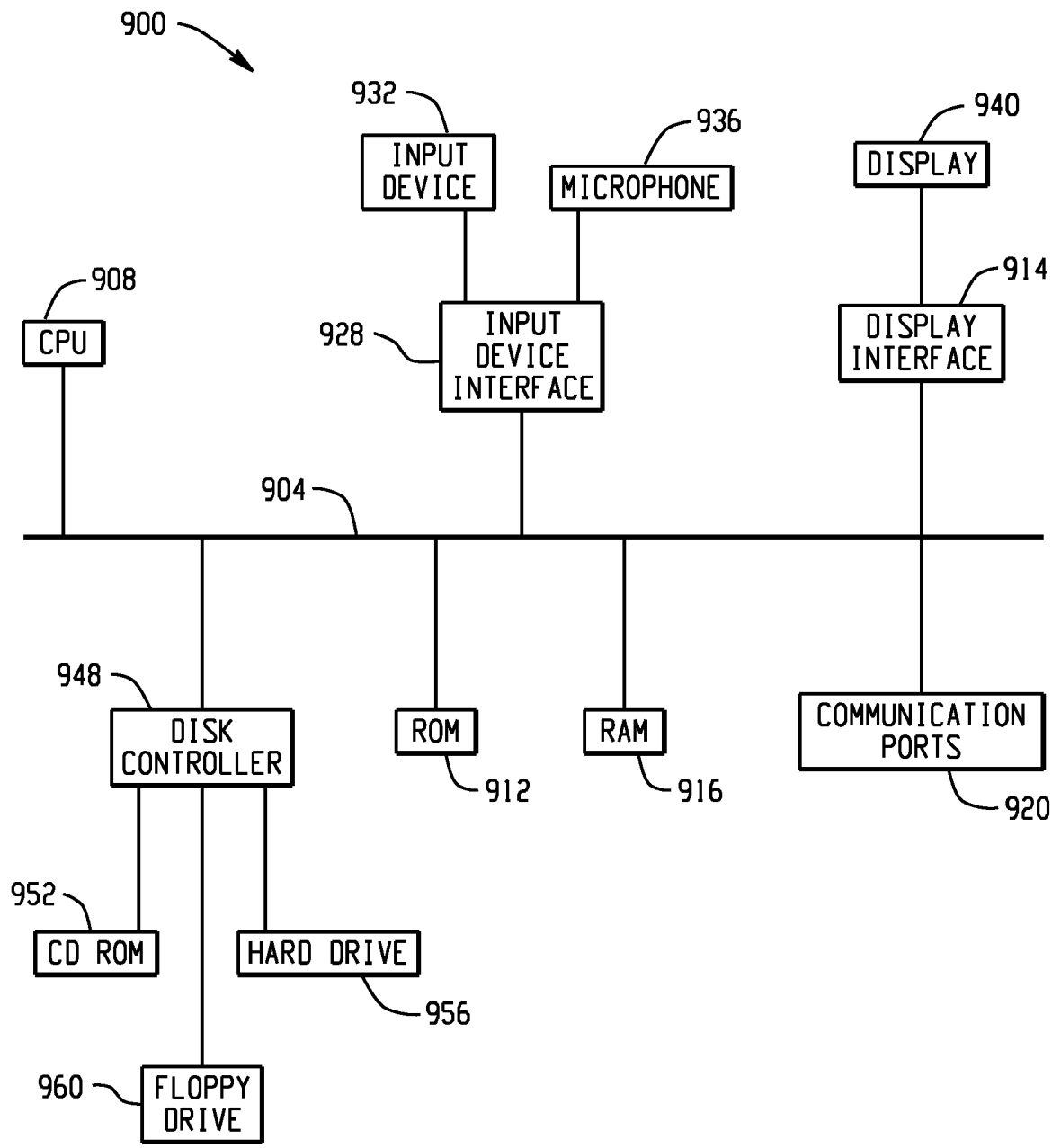
FIG. 9 is a diagram illustrating a computing device to implement aspects provided herein.

FIG. 9 is a diagram 900 illustrating a sample computing device architecture for implementing various aspects described herein. A bus 904 can serve as the information highway interconnecting the other illustrated components of the hardware. A processing system 908 labeled CPU (central processing unit) (e.g., one or more computer processors/data processors at a given computer or at multiple computers), can perform calculations and logic operations required to execute a program. A non-transitory processor-readable storage medium, such as read only memory (ROM) 912 and random access memory (RAM) 916, can be in communication with the processing system 908 and can include one or more programming instructions for the operations specified here. Optionally, program instructions can be stored on a non-transitory computer-readable storage medium such as a magnetic disk, optical disk, recordable memory device, flash memory, or other physical storage medium.

In one example, a disk controller 948 can interface with one or more optional disk drives to the system bus 904. These disk drives can be external or internal floppy disk drives such as 960, external or internal CD-ROM, CD-R, CD-RW or DVD, or solid state drives such as 952, or external or internal hard drives 956. As indicated previously, these various disk drives 952, 956, 960 and disk controllers are optional devices. The system bus 904 can also include at least one communication port 920 to allow for communication with external devices either physically connected to the computing system or available externally through a wired or wireless network. In some cases, the at least one communication port 920 includes or otherwise comprises a network interface.

To provide for interaction with a user, the subject matter described herein can be implemented on a computing device having a display device 940 (e.g., a CRT (cathode ray tube) or LCD (liquid crystal display) monitor) for displaying information obtained from the bus 904 via a display interface 914 to the user and an input device 932 such as keyboard and/or a pointing device (e.g., a mouse or a trackball) and/or a touchscreen by which the user can provide input to the computer. Other kinds of input devices 932 can be used to provide for interaction with a user as well; for example, feedback provided to the user can be any form of sensory feedback (e.g., visual feedback, auditory feedback by way of a microphone 936, or tactile feedback); and input from the user can be received in any form, including acoustic, speech, or tactile input. The input device 932 and the microphone 936 can be coupled to and convey information via the bus 904 by way of an input device interface 928. Other computing devices, such as dedicated servers, can omit one or more of the display 940 and display interface 914, the input device 932, the microphone 936, and input device interface 928.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein may be implemented on a computer having a display device (e.g., a CRT (cathode ray tube) or LCD (liquid crystal display) monitor) for displaying information to the user and a keyboard and a pointing device (e.g., a mouse or a trackball) and/or a touch screen by which the user may provide input to the computer. Other kinds of devices may be used to provide for interaction with a user as well; for example, feedback provided to the user may be any form of sensory feedback (e.g., visual feedback, auditory feedback, or tactile feedback); and input from the user may be received in any form, including acoustic, speech, or tactile input.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A computer-implemented method for meshing a plurality of objects comprising:
    determining a priority level for each object in the plurality of objects based on whether that object includes a dirty model condition within or between that object and another object of the plurality of objects, wherein an object with a dirty model condition has a higher priority and a separate object without the dirty model condition has a lower priority; and
    meshing each of the plurality of objects in sequence according to the priority level of each object, wherein the object having a higher priority is meshed prior to the separate object having the lower priority.

2. The method of claim 1, wherein the meshing comprises imprinting objects to each other based on their respective priority levels.

3. The method of claim 2, wherein conflicts when imprinting an object having a higher priority to an object having a lower priority are resolved in favor of the object with the higher priority.

4. The method of claim 1, wherein the meshing comprises:
    ignoring edges on a first object that intersect with a second object, the second object having a higher priority than the first object.

5. The method of claim 1, wherein the meshed objects form part of an adaptive volume mesh.

6. The method of claim 1, wherein the dirty model condition includes one or more of: a curve misalignment, a non-manifold condition, or a topological defect.

7. The method of claim 1 further comprising:
    rendering, in a graphical user interface, a visualization corresponding to the meshed objects.

8. A non-transitory computer-readable storage medium including instructions, which when executed by at least one computing device, result in operations comprising:
    determining a priority level for each object in the plurality of objects based on whether that object includes a dirty model condition within or between that object and another object of the plurality of objects, wherein an object with a dirty model condition has a higher priority and a separate object without the dirty model condition has a lower priority;
    generating, for each of the plurality of objects, a corresponding mesh; and
    imprinting at least a portion of the meshes to each other such that conflicts arising between meshes are resolved in favor of an object having a higher priority.

9. The non-transitory computer-readable storage medium of claim 8, wherein the objects are imprinted to each other based on their respective priority.

10. The non-transitory computer-readable storage medium of claim 9, wherein the imprinting comprises:
    ignoring edges on a first object that intersect with a second object, the second object having a higher priority than the first object.

11. The non-transitory computer-readable storage medium of claim 8, wherein the meshed objects form part of an adaptive volume mesh.

12. The non-transitory computer-readable storage medium of claim 11, wherein the dirty model condition includes one or more of: curve misalignment, a non-manifold condition, or a topological defect.

13. The non-transitory computer-readable storage medium of claim 12, wherein the operations further comprise:
    rendering, in a graphical user interface, a visualization corresponding to the meshed objects.

14. A system for meshing a plurality of objects comprising:
    at least one data processor; and
    memory storing instructions which, when executed by the at least one data processor, result in operations comprising:
        determining a priority level for each object in the plurality of objects based on whether that object includes a dirty model condition within a body associated in that object, wherein an object with a dirty model condition has a higher priority and a separate object without the dirty model condition has a lower priority; and
        sequentially meshing the objects according to their respective priority levels such that all objects having a first priority level are meshed prior to objects having a second, lower priority level.

15. The system of claim 14, wherein the sequential meshing comprises imprinting objects to each other based on their respective priority levels.

16. The system of claim 15, wherein conflicts when imprinting an object having a higher priority to an object having a lower priority are resolved in favor of the object with the higher priority.

17. The system of claim 14, wherein the meshing comprises:
    ignoring edges on a first object that intersect with a second object, the second object having a higher priority level than the first object.

18. The system of claim 14, wherein the meshed objects form part of an adaptive volume mesh.

19. The system of claim 14, wherein the dirty model condition is a self-intersection of a mesh.

20. The system of claim 14, wherein the operations further comprise:
   rendering, in a graphical user interface, a visualization corresponding to the meshed objects.

* * * * *